United States Patent
Kim et al.

(10) Patent No.: US 10,770,393 B2
(45) Date of Patent: Sep. 8, 2020

(54) BEOL THIN FILM RESISTOR

(71) Applicant: International Business Machines Corporation, Armonk, NY (US)

(72) Inventors: Andrew Tae Kim, Poughkeepsie, NY (US); Baozhen Li, South Burlington, NY (US); Ernest Y. Wu, Essex Junction, VT (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/925,835

(22) Filed: Mar. 20, 2018

(65) Prior Publication Data

US 2019/0295947 A1    Sep. 26, 2019

(51) Int. Cl.
| | |
|---|---|
| *H01L 29/00* | (2006.01) |
| *H01L 23/522* | (2006.01) |
| *H01L 23/525* | (2006.01) |
| *H01L 27/01* | (2006.01) |
| *H01L 21/768* | (2006.01) |
| *H01L 23/532* | (2006.01) |

(52) U.S. Cl.
CPC ...... *H01L 23/5228* (2013.01); *H01L 21/7687* (2013.01); *H01L 21/76829* (2013.01); *H01L 21/76895* (2013.01); *H01L 23/5226* (2013.01); *H01L 23/5258* (2013.01); *H01L 23/53223* (2013.01); *H01L 27/016* (2013.01)

(58) Field of Classification Search
CPC .................................................. H01L 23/5228
See application file for complete search history.

(56) References Cited

U.S. PATENT DOCUMENTS

| | | |
|---|---|---|
| 5,475,254 A | 12/1995 | Takahashi |
| 5,485,138 A | 1/1996 | Morris |
| 5,502,431 A | 3/1996 | Usui |
| 6,083,785 A | 7/2000 | Segawa et al. |
| 6,207,560 B1 | 3/2001 | Lee |
| 7,902,629 B2 | 3/2011 | Chinthakindi et al. |
| 8,013,394 B2 | 9/2011 | Chinthakindi et al. |
| 8,093,679 B2 | 1/2012 | Chinthakindi et al. |
| 8,921,975 B2 | 12/2014 | Anderson et al. |
| 8,922,328 B2 | 12/2014 | Wu et al. |
| 8,927,411 B2 | 1/2015 | Anderson et al. |

(Continued)

OTHER PUBLICATIONS

Xiaoxu Kang, Development and Characterization of Tan Thin Film Resistor with CMOS Compatible Fabrication Process, IEEE 12th International Conference on ASIC (ASICON), Abstract only; 1 page (2017).

*Primary Examiner* — Ismail A Muse
(74) *Attorney, Agent, or Firm* — Cantor Colburn LLP; Vazken Alexanian

(57) ABSTRACT

Back end of the line precision resistors that allow for high currents and for configuration as an eFuse by embedding a single thin film high resistive metal material within a dielectric layer, wherein the resisters are coupled to sidewalls of adjacent metal interconnects are described. The resistors can be formed in the metal one (M1) dielectric layer and can be coupled to sidewalls of the M1 interconnects. Also described are processes for fabricating integrated circuits including the resistors and/or e-Fuses.

17 Claims, 4 Drawing Sheets

(56) References Cited

U.S. PATENT DOCUMENTS

| | | | |
|---|---|---|---|
| 9,536,829 B2 | 1/2017 | Farooq et al. | |
| 2007/0120218 A1* | 5/2007 | Hsu | H01L 23/5256 257/529 |
| 2008/0237800 A1 | 10/2008 | Chinthakindi et al. | |
| 2009/0140387 A1* | 6/2009 | Yang | H01L 23/5228 257/536 |
| 2010/0133649 A1* | 6/2010 | Lin | H01L 23/5256 257/529 |
| 2011/0127635 A1 | 6/2011 | Chinthakindi et al. | |
| 2013/0113102 A1* | 5/2013 | Bao | H01L 21/76846 257/751 |
| 2013/0176073 A1* | 7/2013 | Bao | H01L 23/5226 327/525 |
| 2014/0239445 A1 | 8/2014 | Nishimura et al. | |
| 2014/0319651 A1* | 10/2014 | Wu | H01L 23/5256 257/529 |
| 2014/0353796 A1* | 12/2014 | Lavoie | H01L 28/00 257/529 |
| 2015/0294970 A1 | 10/2015 | Jakushokas et al. | |
| 2016/0204064 A1* | 7/2016 | Horak | H01L 21/76814 257/529 |
| 2017/0047286 A1* | 2/2017 | Basker | H01H 69/022 |
| 2017/0047288 A1* | 2/2017 | Basker | H01L 21/31051 |
| 2017/0069708 A1 | 3/2017 | Ali et al. | |
| 2017/0221797 A1 | 8/2017 | Tseng et al. | |
| 2018/0130741 A1* | 5/2018 | Wu | H01L 23/5256 |
| 2018/0301559 A1* | 10/2018 | Liaw | H01L 27/0886 |

* cited by examiner

BEOL THIN FILM RESISTOR

BACKGROUND

The present invention generally relates to semiconductor integrated circuits and a method of fabrication thereof. The present invention relates more specifically to a back end of line (BEOL) thin film resistor and methods of fabricating the same.

Recently, doped polysilicon resistors have been replaced with single thin film resistors that are formed of a material that has a higher resistivity than that of polysilicon. Examples of such higher resistivity materials include, but are not limited to titanium nitride and tantalum nitride. Integrated circuits including these resistors require the fabrication of vias having different heights, e.g., vias that land on the resistor and regular vias that land on an underlying metal to form the metal interconnect, which imposes integration challenges.

SUMMARY

Embodiments of the present invention are generally directed to integrated circuits including BEOL thin film resistors and methods for fabricating the same. A non-limiting example of an integrated circuit according to aspects of the invention includes a dielectric layer including one or more metal interconnects. A resistor is formed of a material having a resistivity greater than doped polysilicon, wherein the resistor is electrically coupled to sidewalls of adjacent metal interconnects. The resistor, the dielectric layer, and the one or more metal interconnects have coplanar upper surfaces. A cap layer is positioned on the coplanar surfaces of the resistor, the metal interconnect and the dielectric layers such that the resistor is embedded within the dielectric layer.

A non-limiting example method for forming an integrated circuit including a BEOL resistor according to aspects of the invention includes depositing a dielectric layer onto a substrate and patterning the dielectric layer to form a plurality of trenches. A portion of the dielectric layer between at least two adjacent trenches is removed to form a recess, and a metal layer is conformally deposited. A metal conductor is deposited onto the dielectric layer filling the trenches and forming an overburden thereon. The overburden is removed from the dielectric layer height to form metal interconnects, wherein the metal layer remains on a surface of the recessed dielectric layer so as to define a resistor, and wherein the resistor is electrically coupled to sidewalls of the at least two adjacent metal interconnects. A cap layer is deposited onto the resistor and the dielectric layer, wherein the resistor is embedded within the dielectric layer.

Embodiments of the invention are directed to a method of forming an integrated circuit. A non-limiting example method for forming an integrated circuit according to aspects of the invention includes at least one eFuse structure that includes a tantalum nitride metal in contact with sidewalls of contact structures of an anode and a cathode, wherein the eFuse structure further includes tantalum nitride.

Additional features and advantages are realized through the techniques of the present invention. Other embodiments and aspects of the invention are described in detail herein and are considered a part of the claimed invention. For a better understanding of the invention with advantages and features, refer to the description and to the drawings.

DETAILED DESCRIPTION

Figure 1:
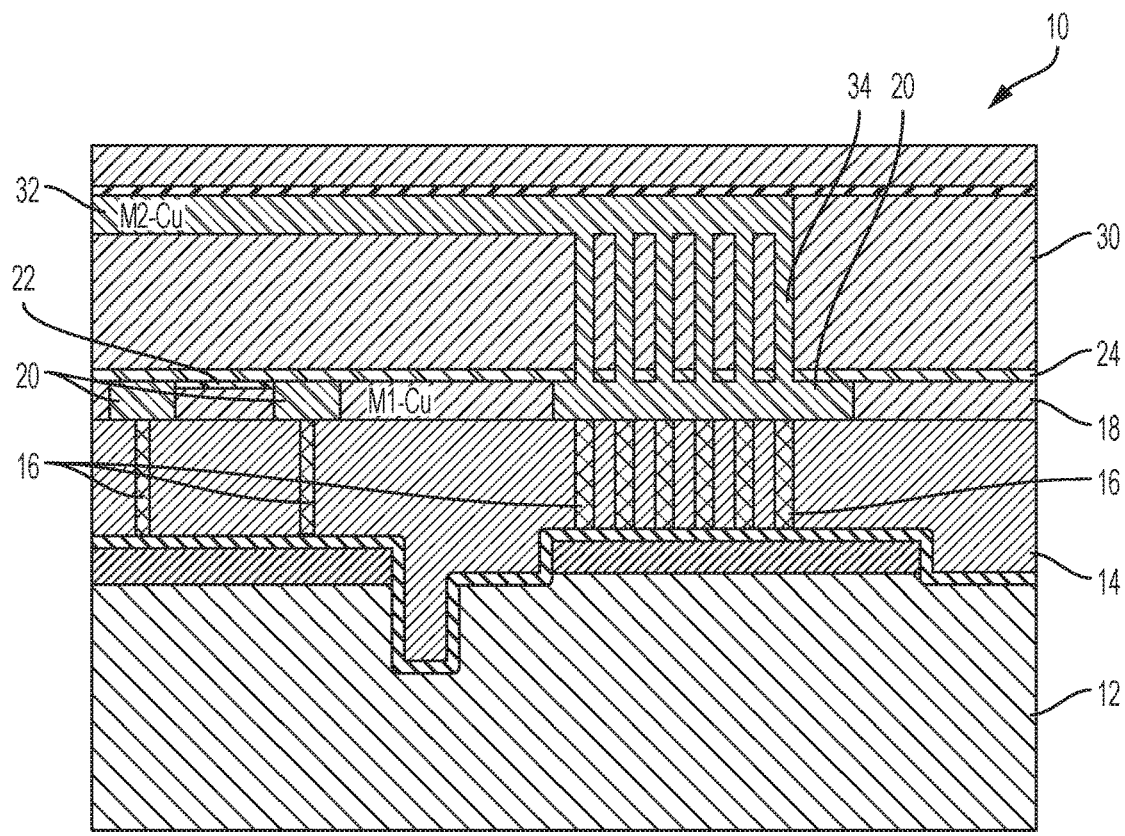
FIG. 1 depicts a cross section pf an integrated circuit including a resistor formed in a back end of line (BEOL) metal one dielectric layer in accordance with one or more embodiments of the present invention.

The present invention generally relates to single thin film resistors that are formed of a high resistivity material that can be provided in the lower metal levels eliminating the topography issues noted in the prior art. With technology scaling, via height is continually reduced, and as a result, the lower metal levels do not have enough vertical space to host the resistor due to the extra topography and current processes to form these resistors. In order to accommodate these challenges and the topography needed for high resistive resistors, the location of these resistors is limited to the upper metal levels, which have relatively thicker metal and taller vias than the lower metal levels. However the heat generated by the resistor in the upper levels will need to travel longer distances to the substrate, resulting in lower thermal conductance. With the lower thermal conductance, the resistor will become hotter in order to maximize current (Joule heating limits maximum current), so a larger exclusion zone (excluding active circuits or metal lines from the hot zone) will be needed to avoid damage to these materials.

In one or more embodiments of the invention, the high resistivity, thin film resistors are embedded underneath the cap layer of the first metal level (M1) and are fabricated so as to contact the sidewalls of the metal lines, i.e., unlike prior art resistors no extra topography is created. Moreover, by embedding a high resistivity, thin film resistor underneath the M1 cap layer, the resulting resistor has a relatively low temperature coefficient of resistivity (TCR) that is temperature stable and advantageously decreases the exclusion zone area, which is generally defined as an area in which a dielectric material with no active circuits or metal lines is present between lines. The decrease in the exclusion zone and also because the resistor is closer to the substrate provides for improved thermal conduction. In turn, the improved thermal conductance minimizes Joule heating, thereby maximizing the current through the high resistivity, thin film resistor. As will be described in greater detail below, the process of fabricating the high resistivity, thin film resistor includes one extra non-critical masking step to provide the high resistivity, thin film resistor with contact to the sidewalls of the metal lines, thereby avoiding the need for via contacts and eliminating topography challenges.

Detailed embodiments of the integrated circuit including a BEOL thin film resistor and methods for fabricating an integrated circuit including a BEOL thin film resistor according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

Turning now to FIG. 1, there is shown a portion of an integrated circuit 10 including a high resistivity, thin film resistor 22 according to one or more embodiments of the invention. The integrated circuit 10 includes substrate 12, which as noted above can be a semiconductor substrate including transistors, and other circuit elements of the integrated circuit formed during FEOL processing. By way of example, the substrate 12 can include a transistor including a gate oxide upon which a polysilicon layer is patterned.

Dielectric layer 14 is the lowest dielectric layer and is formed on substrate 12. Dielectric layer 14 has a substantially planar top surface. Contacts 16 extend through the dielectric layer 14 and are filled with a conductive metal. Collectively, the level defined by the contacts 16 and the dielectric layer 14 represent the first level of interconnect of the circuit, which is also referred to as the M0 interconnect level. The contacts 16 provide electrical connection to the underlying circuits and devices in the substrate 12. An optional cap layer (not shown) formed from silicon nitride ($Si_3N_4$), silicon carbide (SiC), aluminum nitride (AlN) or other conventional material known to the art can be formed on the planar top surface of dielectric layer 14. The optional cap layer is typically provided when the improved yield justifies the additional expense.

The second level of dielectric 18 is referred to as the M1 (first level metal) dielectric layer since the dielectric layer 18 contains the damascene metal interconnects 20 that represent the first level above the device level. The metal interconnects 20 are separated by a space and extend perpendicular through dielectric layer 18. The metal interconnects are aligned with and electrically coupled to the underlying conductive contacts. The metal interconnects 20 can be composed of any electrically conductive material. For example, the metal interconnects 20 can be composed of copper, cobalt, ruthenium, silver, platinum, aluminum, gold, tungsten and combinations thereof.

The second level of dielectric 18 can also be referred to as the resistor interlevel dielectric layer, since this layer can contain the thin film resistor 22. As shown, the thin film resistor 22 contacts the sidewalls of the two adjacent metal interconnects 20, which advantageously results in close proximity of the resistor to the substrate 12. The close proximity of the resistor 22 to the substrate 12 reduces the exclusion zone and minimizes heat transfer issues. The improved thermal conduction allows the resistor to carry much higher current density.

Figure 10:
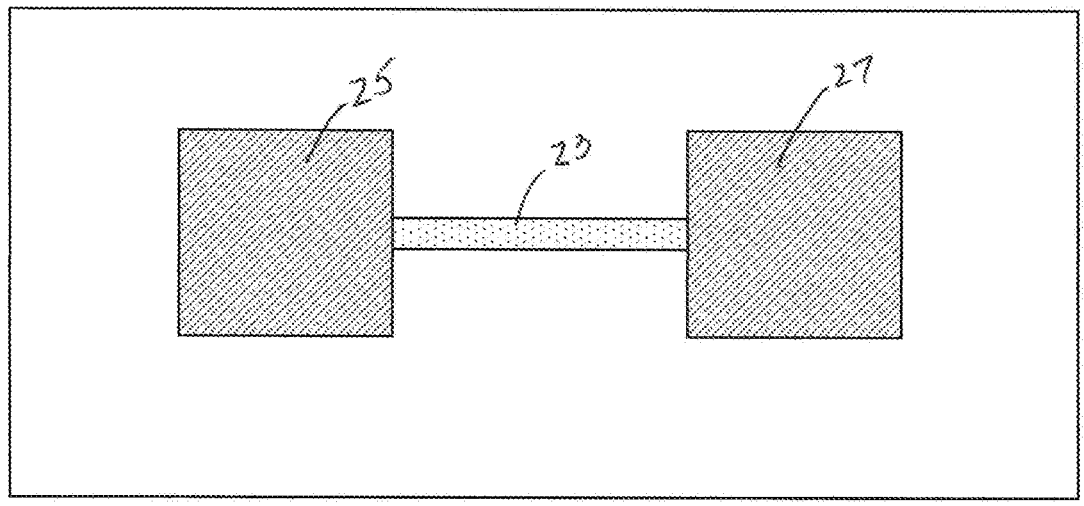
FIG. 10 depicts a top down view of a partially fabricated integrated circuit of FIG. 4 subsequent to formation of an eFuse structure in accordance with one or more embodiments of the resent invention.
Figure 11:
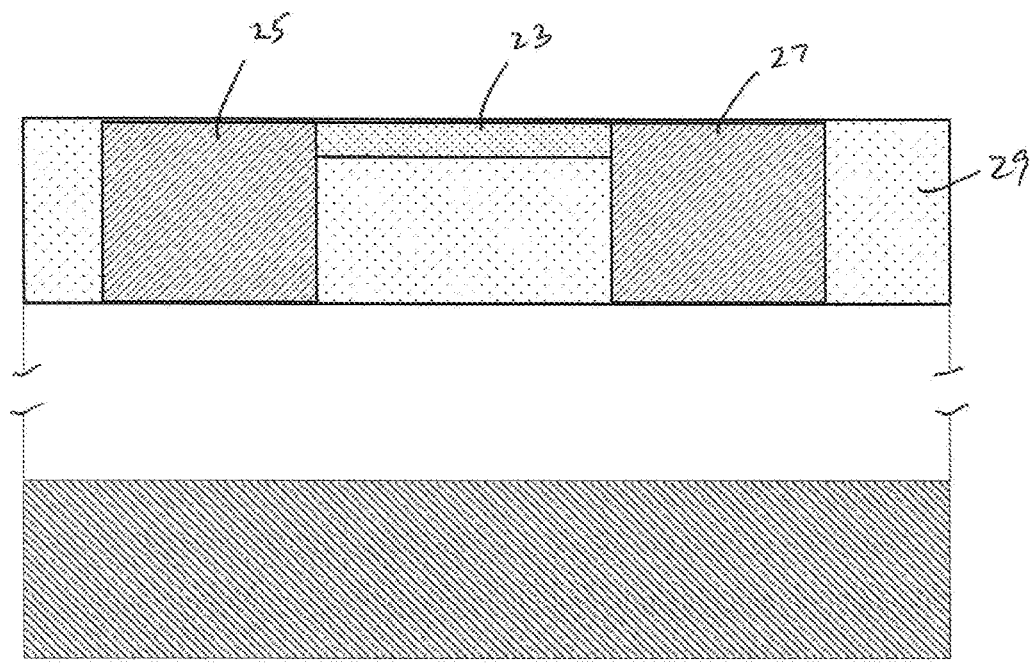
FIG. 11 depicts a cross sectional view of a partially fabricated integrated circuit of FIG. 4 subsequent to formation of an eFuse structure in accordance with one or more embodiments of the present invention.

Although reference to the resistor is specific to the M1 dielectric layer 18, it should be apparent that the resistor structure with its sidewall contact to the metal interconnects can also be fabricated in the upper levels to advantageously minimize topography issues during BEOL fabrication of the metal interconnects. It should also be apparent that the resistor structure 22 could also function as an eFuse, which allows for the circuits on a chip to change while it is in operation. Referring now to FIGS. 10-11, the eFuse 23 can be formed in an upper level dielectric layer 29 by lithographically patterning the dielectric layer 29 to form vias that correspond to an anode and cathode once filled with a conductor followed by formation of a trench to define the eFuse 23. By way of example, a dual damascene process can be used to form the eFuse structure such that only the sidewalls of the eFuse 23 contact the anode 25 and cathode 27. In this manner, the eFuse 23 can be electrically coupled to the sidewalls of contact structures of an anode 25 and a cathode 27, wherein current flowing between the anode and cathode through the eFuse can be effective to electrically open, i.e., break, the eFuse. For example, if certain subsystems fail, or are taking too long to respond, or are consuming too much power, the chip can instantly change its behavior by "blowing" the eFuse.

In one or more embodiments, the thin film resistor 22 can have a thickness less than 15 nanometers (nm). In one or more embodiments, the thin film resistor thickness is from about 1 nm to about 15 nm, and in still one or more embodiments, the thin film resistor can have a thickness from about 2 nm to about 10 nm. The thin film resistor 22 can be formed of a high resistivity material including, but not limited to, titanium nitride (TiN) and tantalum nitride (TaN).

A cap layer 24, also referred to as the M1 cap layer, is deposited over the M1 interlayer dielectric 18 and the thin film resistor 22. The cap layer can be made of any suitable capping material such as silicon nitride, silicon carbide, silicon oxycarbide, hydrogenated silicon carbide, silicon dioxide, aluminum nitride, aluminum oxide, organosilicate glass, or other conventional material known to the art. The cap layer can be formed by using plasma enhanced chemical vapor deposition (PECVD), high density plasma chemical vapor deposition (HDPCVD), low pressure chemical vapor deposition (LPCVD) or other suitable process technique known in the art. Thus, the thin film resistor 22 is completely embedded underneath the M1 cap layer 24 within the M1 dielectric layer 18 and is electrically coupled to the sidewalls of the metal interconnects.

One or more additional levels of metal interconnects are provided on the substrate 12. As shown, a third level of dielectric 30, referred to as the M2 (second level metal) dielectric layer is provided on the M1 cap layer 24. The metal interconnects are formed in the dielectric layer 30 typically by a dual damascene process in which vias 34 are first formed followed by formation of a trench 32, which are then filled with a conductive metal such as copper, aluminum copper alloys or the like. The integrated circuit 10 can include numerous metal interconnect levels as desired for different applications.

Figure 2:
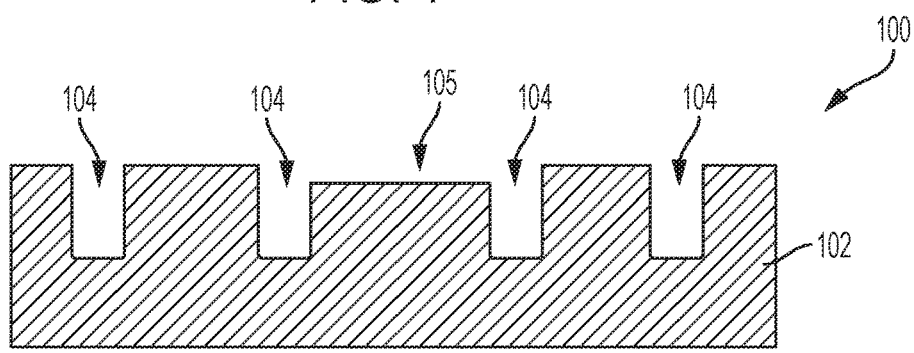
FIG. 2 depicts a cross section of an integrated circuit including a dielectric layer of an integrated circuit with one or more openings formed therein and a recess between adjacent openings in accordance with one or more embodiments of the present invention.

Turning now to FIGS. 2-5, there is depicted a process for fabricating an integrated circuit 100 including a high resistivity, thin film resistor in accordance with one or more embodiments of the present invention. As shown in FIG. 2, the process begins by depositing a dielectric layer 102 (e.g., a M1 dielectric layer) onto a substrate (not shown). Dielectric layer 102 is not intended to be limited and can be one of a number of different dielectric materials commonly used in integrated circuit fabrication. For example, dielectric layer 102 can be silicon dioxide, silicon nitride, or a doped glass layer, such as phosphorus silicate glass, boron silicate glass, and the like. In one or more embodiments, the dielectric layer can be a low k dielectric layer, wherein low k generally refers to materials having a dielectric constant less than silicon dioxide. Exemplary low k dielectric materials include, without limitation, SiLK® from Dow Chemical, Coral® from Novellus, Black Diamond® from Applied Materials, and spin on dielectrics can be used. Coral® can be described generically as a SiCOH dielectric. Depending upon the particular dielectric material, dielectric layer 102 can be formed by chemical vapor deposition deposited (CVD), plasma enhanced chemical vapor deposition (PECVD), atmospheric deposition as well as spin on techniques.

Once the dielectric layer 102 has been deposited, trench features 104 are next photolithographically patterned and etched into the dielectric layer 102 by a single damascene process, for example. A selective reactive ion etch can be used to form the trenches in the dielectric layer. A recess 105 is then photolithographically formed in the dielectric layer 102 between adjacent trenches 104, wherein the depth of the recess will define the maximum thickness of the resistor and the distance between the adjacent trenches will define the length of the resistor. Although a single damascene example is given here, a dual damascene interconnect will work as well.

Figure 3:
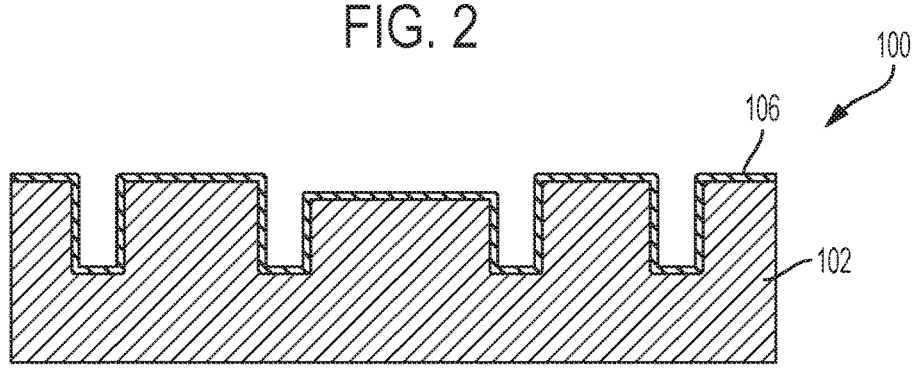
FIG. 3 depicts a cross section of the integrated circuit of FIG. 2 subsequent to deposition of a conformal metal layer in accordance with one or more embodiments of the present invention.

In FIG. 3, a high resistivity metal layer 106 is then conformally deposited onto the patterned dielectric layer 102 including surfaces defining the trench 104 and recess 105. For example, tantalum, tantalum nitride or titanium nitride can be deposited. The presence of the high resistivity metal layer 106 insures that copper, for example, participating in the interdiffusion during subsequent processes and during product lifetime, will not further diffuse into dielectric layer. The high resistivity metal layer can be deposited by a suitable deposition process such as, for example, atomic layer deposition (ALD), chemical vapor deposition (CVD), plasma enhanced chemical vapor deposition (PECVD), sputtering, chemical solution deposition, or plating. This layer can also be formed through nitridation or UV nitridation of a deposited metal layer.

Figure 4:
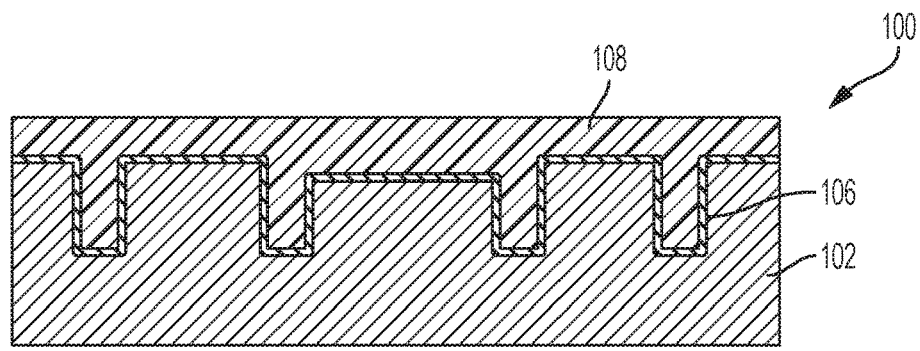
FIG. 4 depicts a cross section of the integrated circuit of FIG. 3 subsequent to deposition of a conductive metal onto the conformal metal layer in accordance with one or more embodiments of the present invention.

Turning now to FIG. 4, a conformal metal seed layer is deposited onto the high resistivity metal layer 106. The function of the seed layer is to provide a base upon which a copper conductor or the like can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

Following deposition of the seed layer, a thick conductive metal layer 106 such as copper is then deposited that significantly overfills the trenches 104. The excess conductive metal is often referred to as the overburden. With regard to some structures, the copper metal layer can include an alloying element such as C, N, O, Cl or S, which have been shown to improve the reliability of the copper conductor. The amount of alloying element in the copper alloy is typically in the range of about 0.001 weight percent (wt. %) to about 10 wt %. The conductive metal layer 106 can be formed by electroless, CVD or electrochemical deposition processes. The deposition of copper can proceed by electrochemical deposition such as electroplating or electroless plating.

Figure 5:
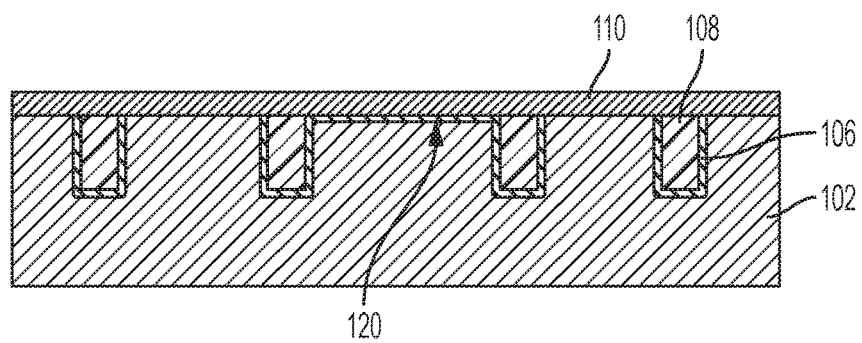
FIG. 5 depicts a cross section of the integrated circuit of FIG. 4 subsequent to planarization process and deposition of a cap layer including a resistor embedded in the dielectric layer and underlying the cap layer in accordance with one or more embodiments of the present invention.

As shown in FIG. 5, the substrate is then subjected to chemical-mechanical-polishing (CMP) to remove the overburden from the dielectric layer at full height and define a resistor 120 in the recess between the adjacent metal interconnects 108. The conductive metal within the trenches of the dielectric layer is not removed and becomes the metal interconnects. The resistor 120 is electrically coupled to the sidewalls of the adjacent metal interconnects 108 as shown. The CMP process utilizes a non-selective slurry composition.

The slurry composition contains a silica abrasive material, which removes the excess metal. Because a recess 105 was provided between adjacent metal interconnects, the CMP process is configured to form the resistor 120. A cap layer 110 (e.g., M1 Cap layer) is then deposited onto the planar surface, thereby embedding the resistor within the M1 dielectric layer 102. The cap layer protects the underlying metal lines and resistor metal from oxidation, humidity, and contamination during subsequent processing.

Figure 6:
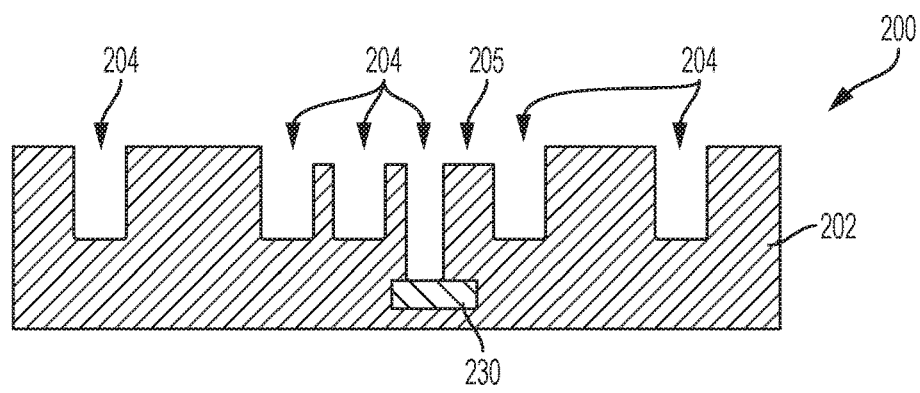
FIG. 6 depicts a cross section of an integrated circuit including a dielectric layer with one or more openings formed therein, a heat sink underlying one of the openings, and a recess between multiple adjacent openings in accordance with one or more embodiments of the present invention.

Referring now to FIGS. 6-9, there is depicted a process for fabricating an integrated circuit 200 including a high resistivity, thin film resistor in accordance with one or more embodiments of the present invention. As shown in FIG. 6, the process begins by depositing and patterning a dielectric layer 202 (e.g., a M1 dielectric layer) to form trench features 204 therein. The dielectric layer 202 further includes previously formed one or more heat sinks 230, one of which is shown, underlying the location of one or more trenches. The heat sinks 230 can be photolithographically formed and filled with a thermally conductive material deposited within a first dielectric layer followed by deposition of a second dielectric layer to define dielectric layer 202. The first dielectric layer including the heat sink formed therein can be the same or different from the second dielectric layer.

The one or more heat sinks can be a metal line or the combination of a metal line and via landing on a lower metal/contact levels, or in the case where multiple heat sinks are fabricated, a combination of a metal line and the metal line and visa line combination. As previously discussed, Joule heating can be an issue with higher resistivity resistors such as those formed from TaN, which can severely limit the maximum current passing through the resistor. Moreover, severe Joule heating has been known to cause a phase change in the TaN, which can lead to a large resistivity jump. The presence of the heat sinks minimizes Joule heating, thereby maximizing current through A recess 205 is then photolithographically formed in the dielectric layer 202 between adjacent trenches 204, wherein the depth of the recess will define the maximum thickness of the resistor and the distance between the adjacent trenches will define the length of the resistor. As shown, the recess 205 can span multiple trenches, four of which are shown, so as to form multiple resistors between the different pairs of adjacent trenches.

Figure 7:
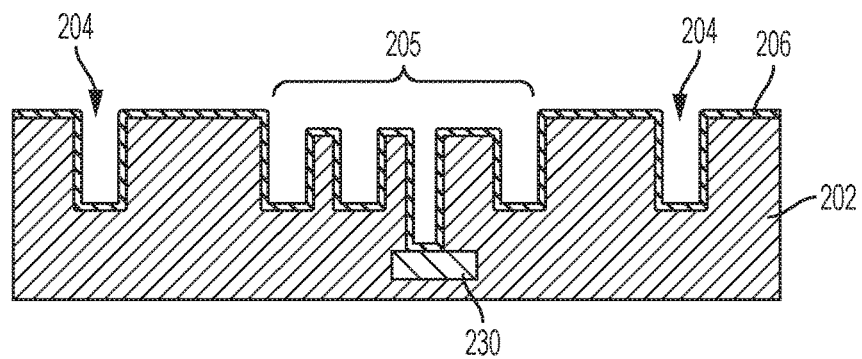
FIG. 7 depicts a cross section of the integrated circuit of FIG. 6 subsequent to deposition of a conformal metal layer in accordance with one or more embodiments of the present invention.

In FIG. 7, a high resistivity metal layer 206 is then conformally deposited onto the patterned dielectric layer 202 including surfaces defining the trench 204 and recess 205.

Figure 8:
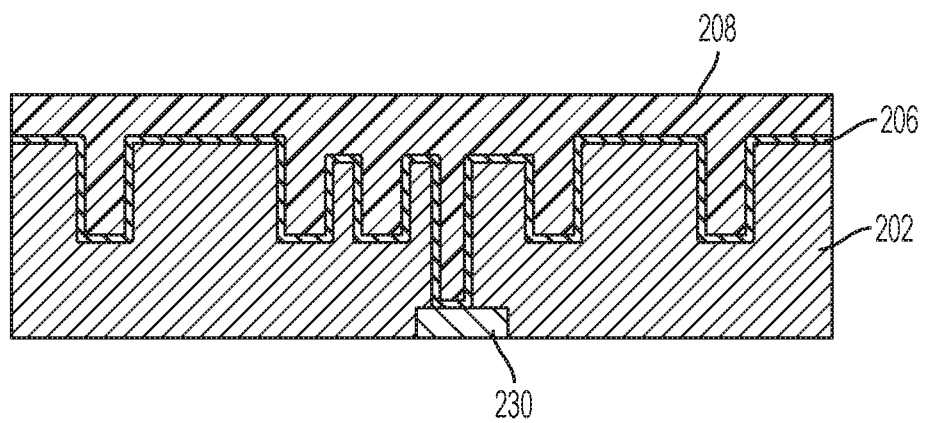
FIG. 8 depicts a cross section of the integrated circuit of FIG. 7 subsequent to deposition of a conductive metal onto the conformal metal layer in accordance with one or more embodiments of the present invention.

In FIG. 8, a conformal seed layer is deposited onto the high resistivity metal layer 206. Following deposition of the seed layer, a copper metal layer 208 is then deposited.

Figure 9:
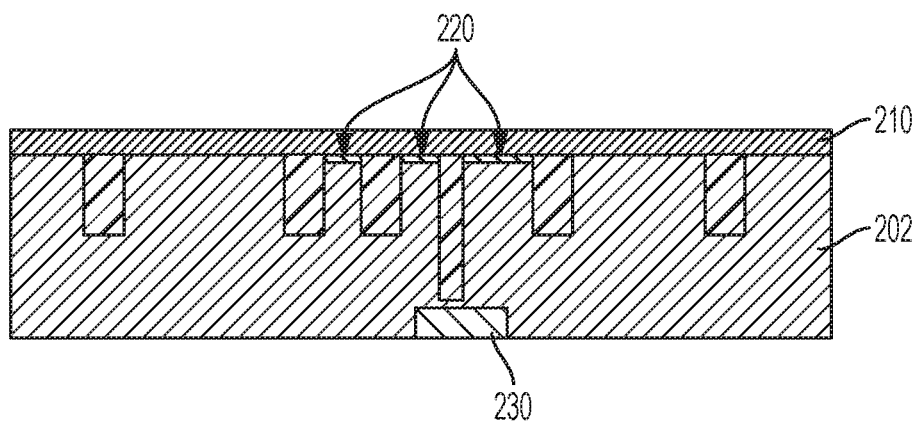
FIG. 9 depicts a cross section of the integrated circuit of FIG. 4 subsequent to planarization process and deposition of a cap layer including resistors embedded in the dielectric layer between adjacent openings and underlying the cap layer in accordance with one or more embodiments of the present invention.

In FIG. 9, the substrate is subjected to chemical-mechanical-polishing (CMP) to define the resistors 220 between adjacent trenches. The CMP process stops at the resistor to form a planar surface on the substrate. A cap layer 210 (e.g., M1 Cap layer) is then deposited onto the substrate, thereby embedding the resistors 220 within the M1 dielectric layer 202.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. An integrated circuit comprising:
    a dielectric layer including one or more metal interconnects;
    one or more heat sinks in the dielectric layer and underlying one or more of the metal interconnects;
    a resistor formed in a recess of the dielectric layer of a material having a resistivity greater than doped polysilicon;
    wherein the resistor has sidewalls, wherein the resistor sidewalls are electrically coupled to sidewalls of adjacent metal interconnects;
    wherein the resistor in the recess of the dielectric layer, the dielectric layer outside of the recess, and the one or more metal interconnects have coplanar upper surfaces; and
    a cap layer on the coplanar surfaces of the resistor, the adjacent metal interconnects electrically coupled to the sidewalls of the resistor, and the dielectric layer such that the resistor is embedded under the cap layer within the recess of the dielectric layer.

2. The integrated circuit of claim 1, wherein the dielectric layer comprises a first metal level (M1) dielectric layer.

3. The integrated circuit of claim 1, wherein the resistor material comprises tantalum nitride or titanium nitride.

4. The integrated circuit of claim 1, wherein the resistor has a thickness less than about 15 nanometers.

5. The integrated circuit of claim 1, wherein the cap layer comprises silicon nitride, silicon carbide, silicon oxycarbide, hydrogenated silicon carbide, silicon dioxide, aluminum nitride, aluminum oxide, or an organosilicate glass.

6. The integrated circuit of claim 1, wherein the dielectric layer comprises silicon dioxide, silicon nitride, phosphorus silicate glass, boron silicate glass, or a low k dielectric layer.

7. The integrated circuit of claim 1, wherein the one or more heat sinks comprises a metal line, a metal line and via, or a combination thereof.

8. The integrated circuit of claim 1, wherein the resistor is configured as an eFuse.

9. A process for fabricating a back end of line resistor, the process comprising:
    depositing a dielectric layer onto a substrate;
    patterning the dielectric layer to form a plurality of trenches;
    removing a portion of the dielectric layer between at least two adjacent trenches to form a recess;
    conformally depositing a metal layer onto the dielectric layer;
    depositing a metal conductor onto the metal layer filling the trenches and forming an overburden thereon;
    removing the overburden to form metal interconnects, wherein the metal layer remains on a surface of the recessed dielectric layer so as to define a resistor, and wherein the resistor has sidewalls, wherein the resistor sidewalls are electrically coupled to sidewalls of the at least two adjacent metal interconnects; and
    depositing a cap layer onto the resistor and the dielectric layer, wherein the resistor is embedded within the dielectric layer.

10. The process of claim 9, wherein removing the overburden comprises a chemical mechanical planarization process stopping at an uppermost surface of the dielectric layer.

11. The process of claim 9, wherein depositing a metal conductor onto the dielectric layer comprises depositing a seed layer followed by electroplating the metal conductor onto the seed layer.

12. The process of claim 9, wherein the metal conductor comprises copper.

13. The process of claim 9, wherein the metal layer defining the resistor comprises titanium nitride or tantalum nitride.

14. The process of claim 9, wherein the resistor has a thickness less than about 15 nanometers.

15. The process of claim 9, wherein the dielectric layer comprises a first metal level (M1) dielectric layer.

16. The process of claim 9, wherein depositing the dielectric layer onto a substrate comprises depositing a first dielectric layer and forming a heat sink therein, and depositing a second dielectric layer onto the first dielectric layer and the heat sink to form the dielectric layer.

17. The process of claim 16, wherein the first and second dielectric layers defining the dielectric layer comprise different materials.

* * * * *